United States Patent [19]
Cutright et al.

[11] Patent Number: 4,683,424
[45] Date of Patent: Jul. 28, 1987

[54] APPARATUS FOR USE IN TESTING CIRCUIT BOARDS

[75] Inventors: Robert A. Cutright; Mark W. Briggs, both of Holland; George J. Bouwman, Hamilton, all of Mich.

[73] Assignee: Wehr Corporation, Milwaukee, Wis.

[21] Appl. No.: 669,117

[22] Filed: Nov. 7, 1984

[51] Int. Cl.$^4$ .................. G01R 31/28; H05K 7/14
[52] U.S. Cl. ........................ 324/158 F; 361/383; 361/415
[58] Field of Search ............ 324/158 F, 73 PC; 361/384, 415, 413, 383

[56] References Cited

U.S. PATENT DOCUMENTS

| | | | |
|---|---|---|---|
| 2,843,806 | 7/1958 | O'Neill | 361/415 X |
| 3,602,774 | 8/1971 | Grant et al. | 361/384 |
| 3,656,058 | 4/1972 | Leathers | 324/158 F |
| 3,689,128 | 9/1972 | Andreini et al. | 361/415 X |
| 3,903,404 | 9/1975 | Beall et al. | 361/384 X |
| 4,145,620 | 3/1979 | Dice | 324/73 PC X |
| 4,148,534 | 4/1979 | Veburg | 324/158 F X |
| 4,179,724 | 12/1979 | Bonhomme | 361/391 |
| 4,337,499 | 6/1982 | Cronin et al. | 361/413 X |
| 4,352,274 | 10/1982 | Anderson et al. | 361/384 X |
| 4,542,341 | 9/1985 | Santomango et al. | 324/158 F |

*Primary Examiner*—Reinhard J. Eisenzopf
*Assistant Examiner*—Stephen M. Baker
*Attorney, Agent, or Firm*—Michael, Best & Friedrich

[57] ABSTRACT

An apparatus for testing circuit boards, the apparatus comprising a plurality of hand manipulable baskets adapted to contain a plurality of generally planar circuit boards. Each of the baskets includes a plurality of first electrical connectors adapted to engage electrical connectors on the circuit boards, and a second electrical connector electrically connected with each of the first electrical connectors. Air can flow freely through the baskets and over the circuit boards supported therein. The apparatus further comprises a test chamber for enclosing the baskets and including an electrical connector electrically connectable with the second electrical connectors on the baskets, and walls within the test chamber cooperating with the baskets to define an air plenum directing air flow through the baskets and over the circuit boards supported therein.

40 Claims, 16 Drawing Figures

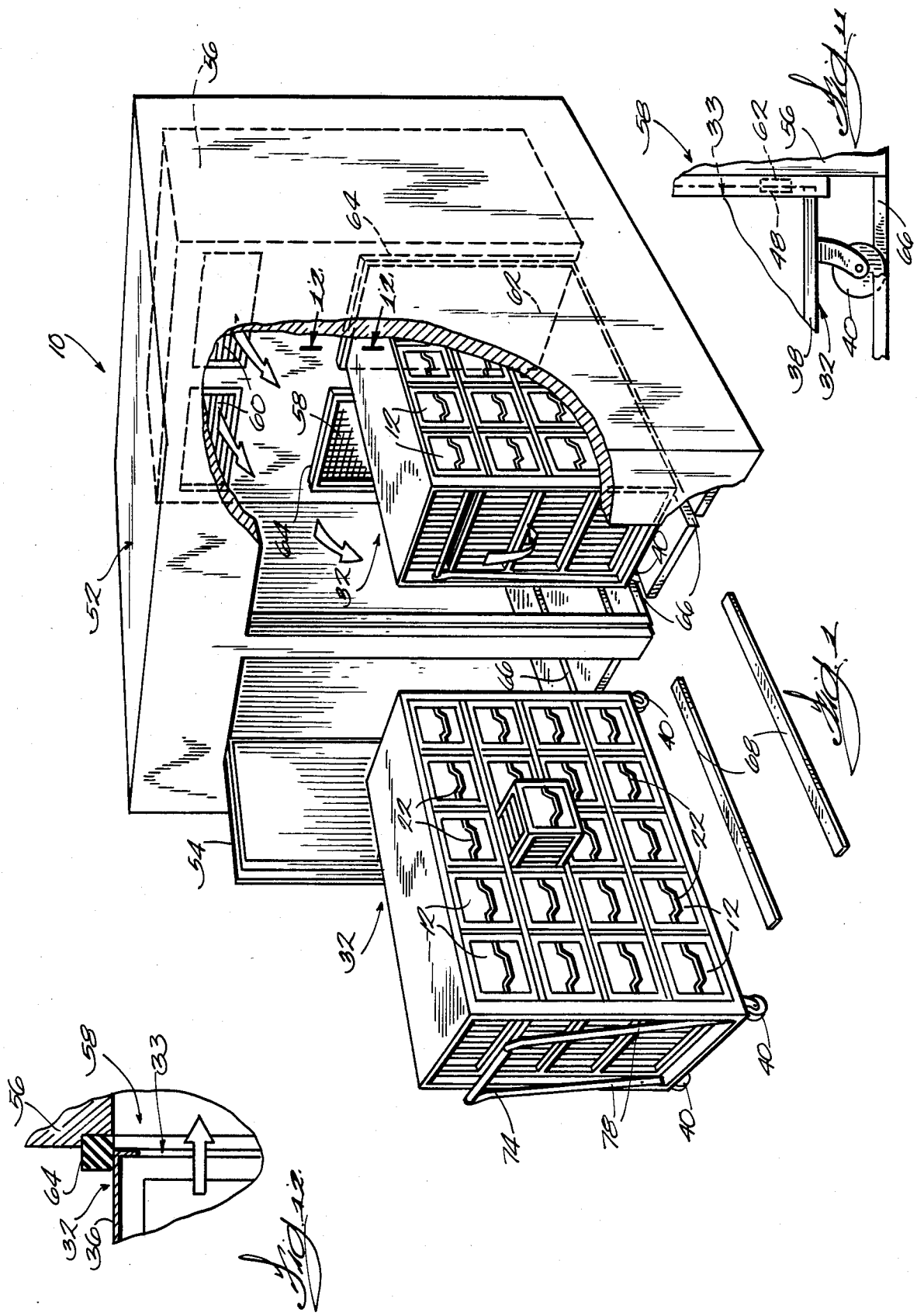

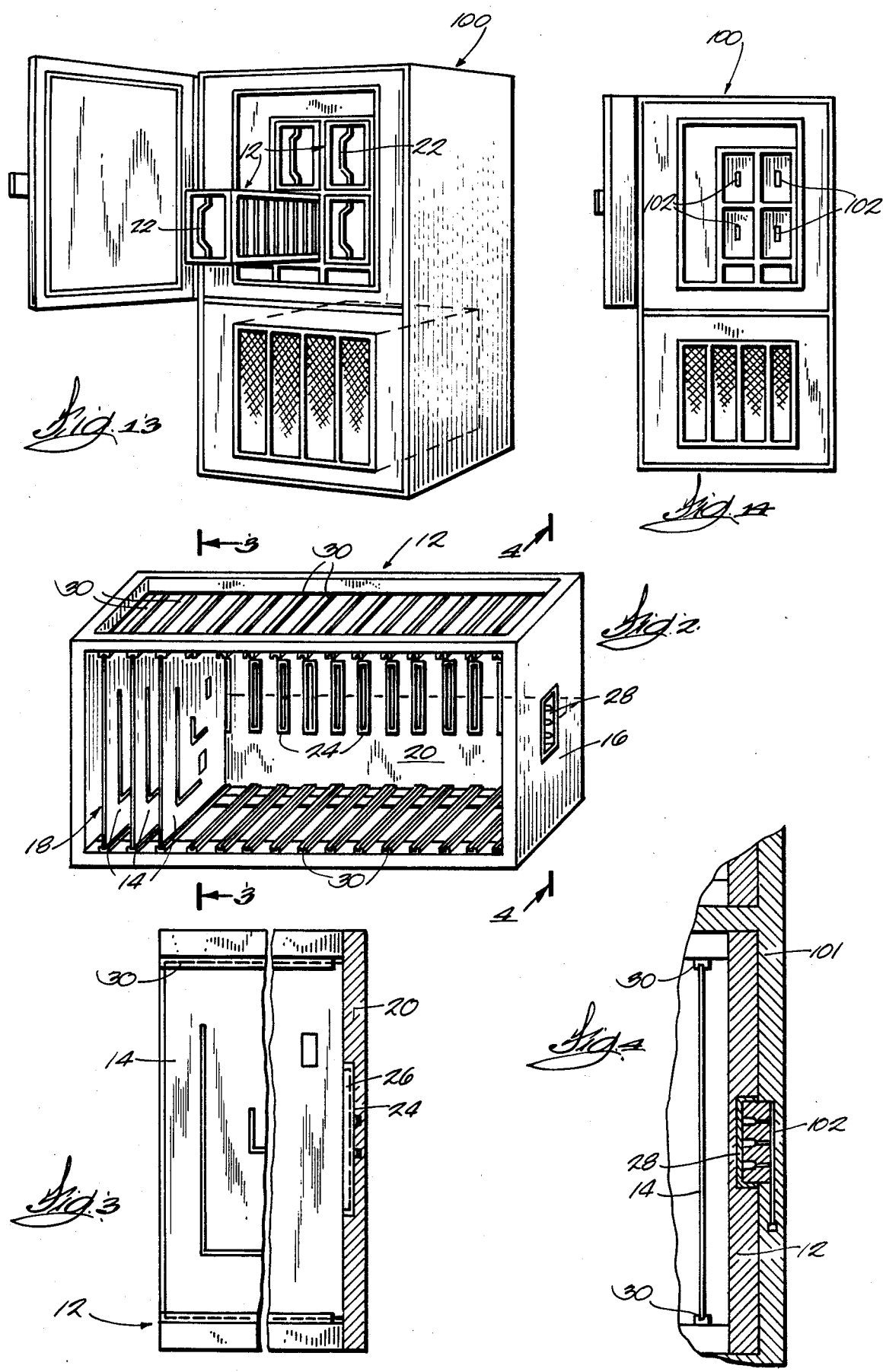

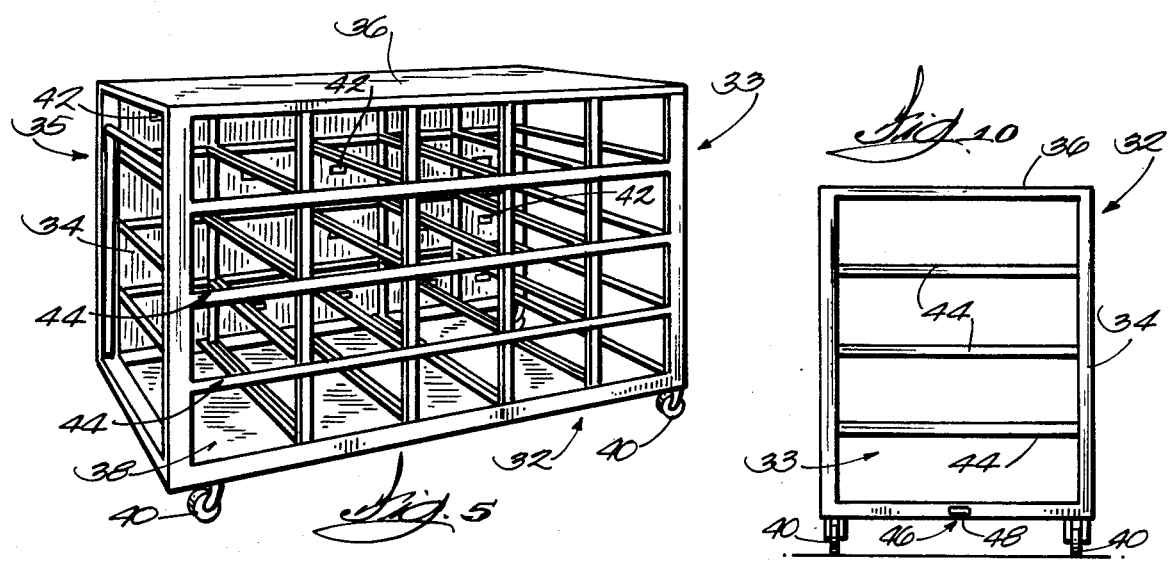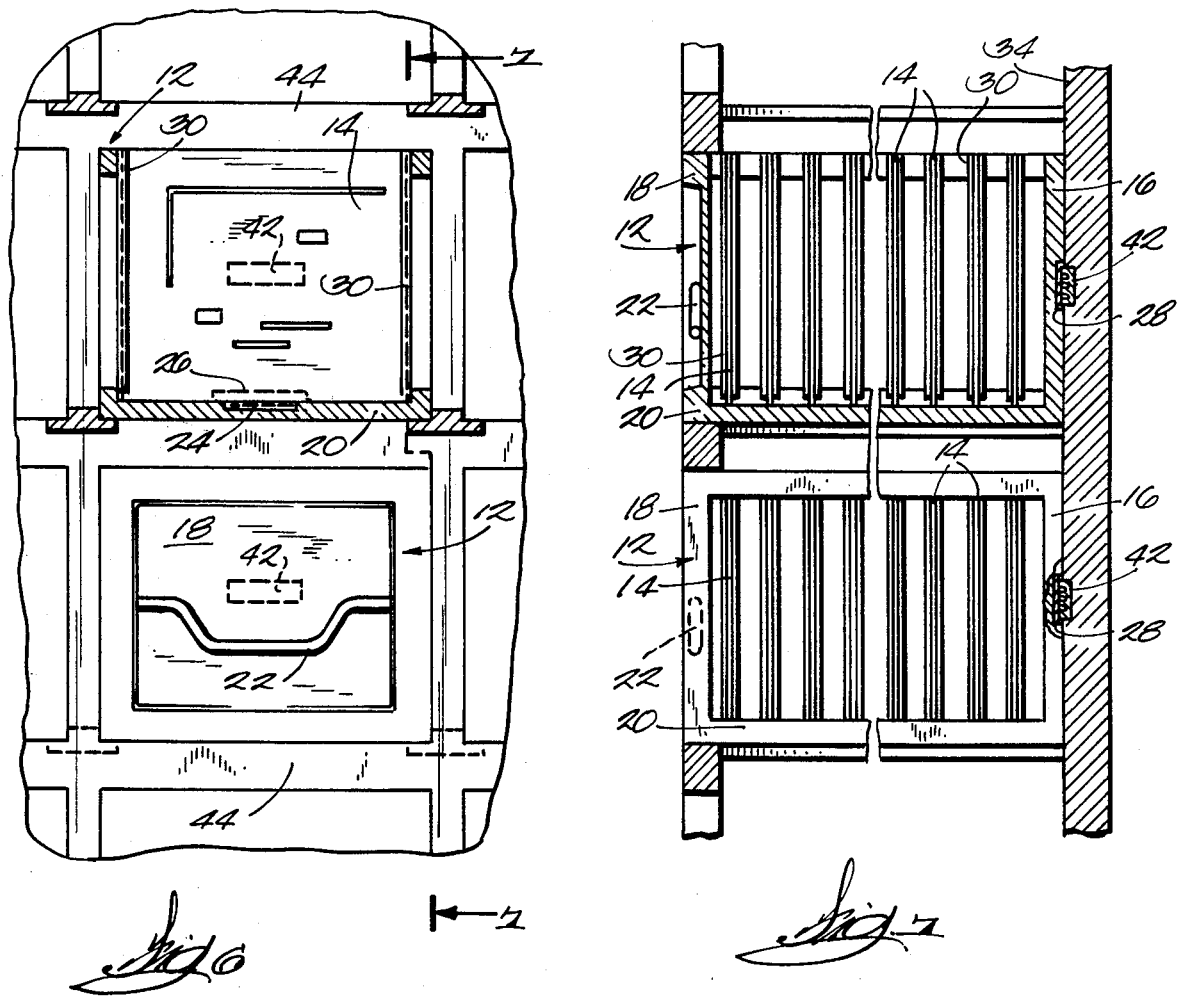

4,683,424

APPARATUS FOR USE IN TESTING CIRCUIT BOARDS

BACKGROUND OF THE INVENTION

The invention relates to apparatus for use in testing electrical apparatus such as circuit boards, and, more particularly, to apparatus for use in "burning in" electrical circuit boards.

Electrical circuit boards are "burned in" by being put through their operational cycles under varying environmental conditions, such as varying temperature and humidity. Burning in is commonly done in a test chamber wherein the circuit boards are subjected to varying environmental conditions while being plugged into an electrical control system for putting the circuit boards through their operational cycles.

SUMMARY OF THE INVENTION

The invention provides an apparatus for use in testing or burning in electrical apparatus such as circuit boards. The apparatus includes hand manipulable baskets adapted to contain a plurality of circuit boards. Each of the baskets has means for supporting circuit boards within the basket, and connector means such that the circuit boards can be electrically connected into the basket. The basket and the supporting means have an open construction such that air can flow freely through the basket and over the circuit boards supported therein. Each basket further includes a handle for facilitating hand manipulation of the basket, and electrical connector means such that the basket and contained circuit boards can be electrically connected as a unit into a cart (described below) or test chamber.

The baskets provide a convenient means for handling the circuit boards in connection with the burn-in operation. They also provide a convenient means for transporting the circuit boards between the burning in station and other test stations. Furthermore, the baskets, in a single structure, provide both the support structure for the circuit boards and the electrical circuitry for accessing the circuit boards for test purposes.

In the preferred embodiment, a cart is provided which includes walls generally closing the cart except for opposite open ends and one open side between the open ends. The baskets preferably have end walls and are inserted into the cart such that the end walls of the baskets close the open side of the cart. When the baskets are inserted into the cart in this manner, the baskets and the cart define an air plenum extending between the opposite open ends of the cart. Air can flow freely through the air plenum defined by the cart and the baskets and over the circuit boards supported therein.

The cart also includes electrical connector means, and each of the baskets is plugged into the electrical connector means when inserted into the cart. The cart is equipped with electrical connector means for plugging the cart and the baskets with the circuit boards as a unit into a test chamber.

The cart is supported on casters and provides a convenient apparatus for transporting a plurality of the circuit board baskets to a walk in test chamber, and the cart includes the necessary electrical circuitry for each of the baskets so that all of the circuit boards supported in the baskets are electrically accessible in the cart.

The test chamber is generally enclosed and includes an air conditioning unit including air intake and outlet openings for circulating conditioned air through the test chamber. The test chamber also includes an electrical connector for receiving the electrical connector on the cart when the cart is moved toward one of the air openings. The cart is positioned in the test chamber with one of its open ends registering with one of the air openings, preferably the intake opening, and so that the electrical connector on the cart engages the electrical receptacle in the test chamber.

The floor of the test chamber may be provided with slots for receiving the casters on the cart for aligning the cart with the air intake opening and the electrical connectors with each other. Bars can be inserted into the slots to level the floor of the test chamber when the cart is not being used to provide a level floor for the chamber.

When the cart is positioned in the test chamber, conditioned air in the test chamber is drawn through the air plenum defined by the cart and the baskets and into the air intake opening. Therefore, the conditioned air flows over the circuit boards contained in the baskets in the cart. Simultaneously, electrical control means via the electrical connectors puts the circuit boards through their operational cycles.

Preferably, the test chamber further includes a flexible seal around the air intake opening for registering with the end of the cart for substantially sealing the air intake opening to the cart. This improves the air flow over the circuit boards contained within the cart.

Because there can be a tight fit between the electrical connectors and between the seal and the end of the cart which may interfere with proper positioning of the cart in the chamber and proper engagement of the electrical connectors, interengageable means between the cart and the test chamber is provided to move the cart into position with a positive force. The interengageable means includes a handle pivotally mounted on the cart and a linkage connectable between the handle and a fixed point in the test chamber such that as the handle is moved relative to the cart in a pushing motion the linkage acts against the fixed point and draws the cart toward the air intake opening.

In an alternative embodiment, the test chamber includes opposite side walls and a rear wall having thereon a plurality of electrical connectors engageable with the electrical connectors on the ends of the individual baskets. The baskets are inserted individually into the test chamber such that the electrical connectors on the baskets engage electrical connectors on the rear wall. The side walls of the test chamber and the closed end walls of the baskets cooperate to define an air plenum directing air flow through the baskets and over the circuit boards supported therein.

Various of the features and advantages of the invention will become apparent to those skilled in the art upon review of the following detained description, claims, and drawings.

DESCRIPTION OF THE DRAWINGS

FIG. 1 is a perspective view, partially cut away, of an apparatus embodying the invention.

FIG. 2 is a perspective view of one of the hand manipulable baskets.

FIG. 3 is a cross sectional view taken along line 3—3 in FIG. 2.

FIG. 4 is a cross sectional view taken along line 4—4 in FIG. 2 and showing the second electrical connector on the basket engaged with an electrical connector inside the test chamber of FIG. 13.

FIG. 5 is a perspective view of one of the carts.

FIG. 6 is a fragmentary side view, partially cut away, of a cart containing baskets.

FIG. 7 is a cross sectional view taken along line 7—7 in FIG. 6.

FIG. 10 is an end view of a cart.

FIG. 11 is an enlarged, fragmentary side view a cart in the test chamber.

FIG. 12 is a cross sectional view taken along line 12—12 in FIG. 1.

FIG. 13 is a perspective view of a test chamber that is part of an alternative embodiment of the invention.

FIG. 14 is a front view of the test chamber shown in FIG. 13 with the baskets removed.

Figure 8:
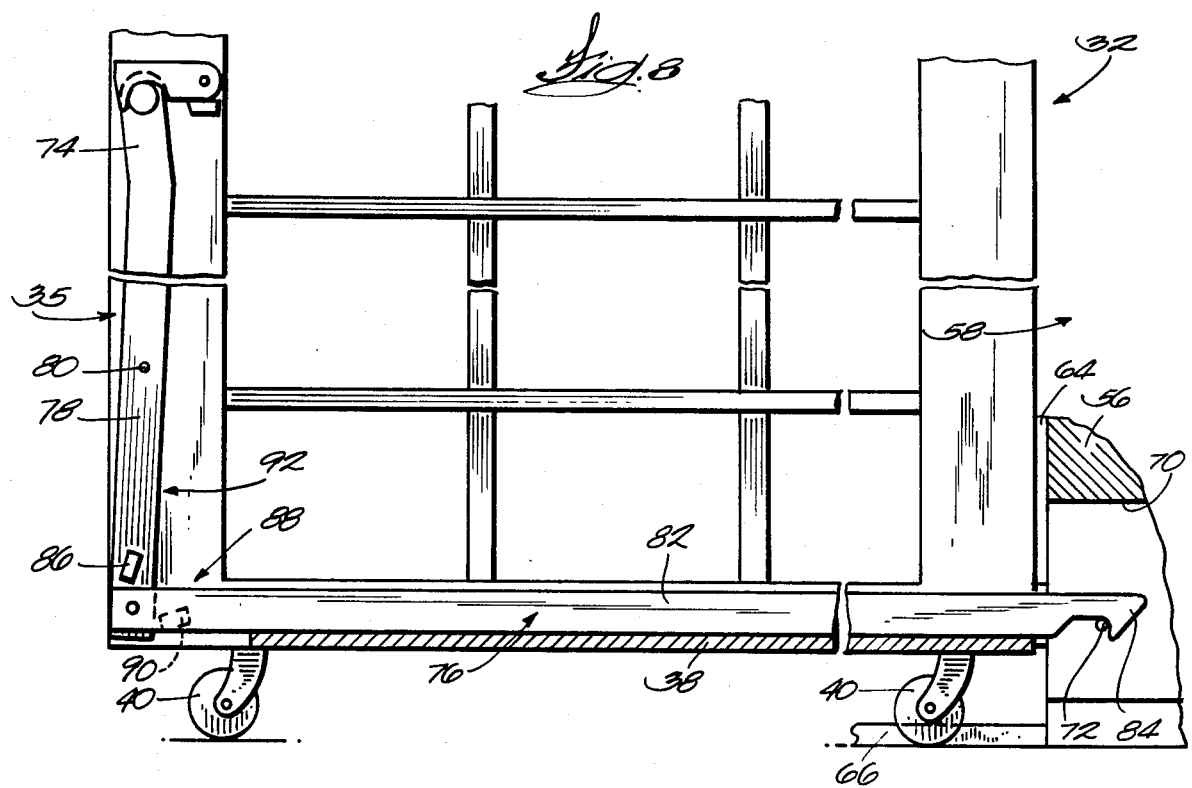
FIG. 8 is a fragmentary, vertical, cross sectional view showing the interengageable means on the cart and in the test chamber for moving the cart toward the air intake opening.

Before explaining one embodiment of the invention in detail, it is to be understood that the invention is not limited in its application to the details of construction and the arrangements of components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

DESCRIPTION OF THE PREFERRED EMBODIMENT

Figure 15:
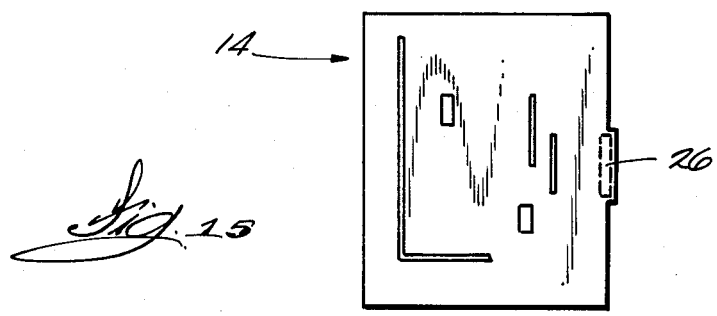
FIG. 15 is a front view of a circuit board.

The drawings illustrate a test chamber 10 for use in testing or burning in electrical circuit boards. The test chamber 10 receives hand manipulable baskets 12 adapted to contain a plurality of circuit boards 14. A circuit board 14 is shown in FIG. 15.

A basket 12 is illustrated in FIG. 2. The basket 12 has a frame defining a box-like structure of generally open construction. The opposite ends of the basket 12 are closed by end walls 16 and 18, and one of the sides of the basket 12 is closed by a side wall 20. The other three sides of the basket 12 are open. A handle 22 (see FIG. 6) is attached to the outside of the end wall 18 for facilitating hand manipulation of the basket 12.

A plurality of generally evenly spaced apart electrical connectors 24 are mounted inside the side wall 20 of the basket 12 and are adapted to receive electrical connectors 26 (see FIG. 15) on the electrical circuit boards 14. The electrical connectors 24 are female connectors, and the connectors 26 on the circuit boards 14 are male connectors. Basket 12 also includes, on the outer surface of the end wall 16, a second electrical connector 28 adapted to be plugged into a test chamber. The electrical connector 28 is electrically connected to each of the electrical connectors 24 by electrical circuitry (indicated by the dotted line in FIG. 2) extending along the side wall 20 and the end wall 16. This circuitry is similar to the circuitry shown in FIG. 16 on a hereinafter described cart 32. Thus, when the electrical connector 28 is plugged into a test chamber, the test chamber is operably connected to each of the circuit boards 14 in the basket 12 by way of the electrical connectors 24.

The basket 12 also includes means for supporting the circuit boards 14 in parallel spaced relationship within the frame means with the electrical connectors 26 on the circuit boards 14 received in electrical connectors 24 in the basket 12, as shown in FIGS. 2 and 3. In one embodiment of the invention, wherein the circuit boards 14 are relatively lightweight, the supporting means consists solely of electrical connectors 24. In the preferred embodiment shown in the drawings, supporting means in addition to electrical connectors 24 is provided so that the basket 12 can hold heavier circuit boards 14.

In the illustrated construction, the supporting means includes a plurality of spaced apart guide tracks 30 fixedly attached to the frame means and extending across opposite open sides. The guide tracks 30 are aligned with the electrical connectors 24 for guiding the electrical connectors 26 on the circuit boards 14 into engagement with electrical connectors 24. Each of the guide tracks 30 includes a channel shaped, elongated member adapted to slidably receive an edge of a circuit board 14.

The baskets 12 provide a convenient means for housing and supporting circuit boards 14 for burning in, as well as for transporting the circuit boards 14 to and from other various testing stations. Furthermore, the baskets 12 include, in one unit, both the electrical circuitry and the support structure for the circuit boards 14.

The test chamber in the preferred embodiment also accommodates carts 32 adapted to contain a plurality of the baskets 12. A cart 32 is illustrated in FIG. 5 and includes opposite open ends 33 and 35, respectively, and one open side between the open ends. A side wall 34 closes the side opposite the open side, and top and bottom walls 36 and 38, respectively, close the top and bottom of the cart 32. The cart 32 is supported by casters 40 connected to the bottom wall 38, as best shown in FIG. 4. The cart 32 includes wall means cooperating with the baskets 12, when positioned in the cart, to define an air plenum directing air flow through the baskets 12 contained in the cart 32 and over the circuit boards 14 supported in the baskets. In the preferred embodiment, the side wall 34 and the top and bottom walls 36 and 38 are the wall means.

The cart 32 also includes a plurality of electrical connectors 42 mounted inside the side wall 34 of the cart 32 and adapted to engage the electrical connectors 28 on the ends of the baskets 12. The cart 32 includes framework 44 for slidably receiving a plurality of baskets 12. The baskets 12 are insertable into the framework 44 such that the second electrical connectors 28 on the ends of the baskets 12 engage the electrical connectors 42 inside the side wall 34 of the cart 32, as shown in FIG. 7, and such that the end walls 38 of the baskets 12 close the open side of the cart 32, as best shown in FIG. 1. With the baskets 12 inserted into the cart 32, the top and bottom and both sides of the cart 32 are closed, and the opposite ends of the cart 32 are open, so that the cart 32 and baskets 12 define an air plenum through which air flow may be directed to pass over the baskets 12 and the circuit boards 14 in the baskets.

In the preferred embodiment, the baskets 12 are inserted into the cart with the side walls 20 of the baskets 12 facing downwardly, as shown in FIG. 6, so that the closed sides of the baskets 12 in each row are aligned to divide the air plenum into separate horizontal air ducts corresponding with each row of baskets 12.

The cart 32 also includes electrical connector means 46 in electrical circuit with each of the electrical connectors 42 and adapted to be plugged into a test chamber. In the preferred embodiment, the electrical connector means 46 includes a main electrical connector 48 on the end 33 of the cart 32. The main electrical connector 48 is slidably engageable with an electrical connector in the test chamber and is preferably located near the bottom of the cart 32, as best shown in FIG. 10.

Figure 16:
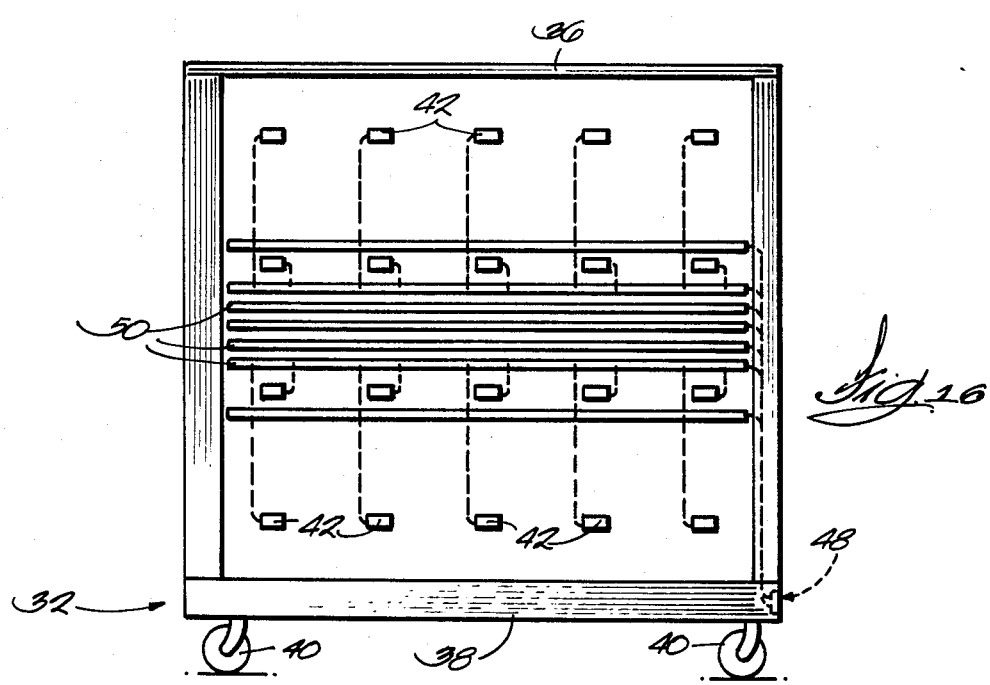
FIG. 16 is a reverse side view of a cart.

The electrical circuitry connecting the main electrical connector 48 to the electrical connectors 42 includes a plurality of bus bars 50 running along the side wall 34 of the cart 32, with each of the bus bars 50 being connected to the main electrical connector 48 and to each of the electrical connectors 42. This is best shown in FIG. 16.

The test chamber 10 also includes a housing 52. The preferred embodiment of the test chamber 10 is shown in FIG. 1. This is a walk-in test chamber adapted to hold two carts 32. The housing 52 is enclosed and includes a pair of doors 54 (only one is shown) in one of the side walls for allowing the carts 32 to be placed within the test chamber 10. When the doors 54 are closed, the test chamber 10 is substantially sealed.

The test chamber 10 includes an air conditioning unit 56 for varying the temperature and humidity of the air within the test chamber. The air conditioning unit 56 includes a pair of airflow openings 58 adapted to register with the open end 33 of a cart 32. In the preferred embodiment, the airflow openings 58 are air intake openings. The air conditioning unit further includes a pair of air outlet openings 60 through which conditioned air is introduced into the test chamber.

The test chamber 10 also includes electrical connectors 62 (see FIGS. 1 and 11) mounted on the wall of the air conditioning unit 56 beneath the air intake openings 58. The electrical connectors 62 are adapted to receive the main electrical connectors 48 on the carts 32. The electrical connectors 62 are connected to electrical control means (not shown) for operating the circuit boards 14 through the desired test cycle.

The test chamber also includes, around each of the air intake openings 58, a flexible seal or gasket 64 (see FIGS. 1 and 12) for registering with the end 33 of the cart 32 to seal the intake opening 58 to the cart 32. In an alternative embodiment of the invention, the seal 64 may be attached to the cart 32 around the end 33 and registers with the air intake opening 58.

When a cart 32 is in position in the test chamber 52 so that it registers with an air intake opening 58, air from the test chamber 10 is directed through the cart 32 into the air intake opening 58. The air is returned to the test chamber 52 by the air outlet opening 60. Therefore, the air flows along a closed path, as indicated by the arrows in FIG. 1, which includes the cart 32, and air flows over each of the circuit boards 14 contained in the cart 32.

In the preferred embodiment, the test chamber 10 is provided with slots 66 (see FIG. 1) in the floor of the test chamber for receiving the casters 40 on the carts 32 so as to align the carts 32 with the air intake openings 58 and to align the main electrical connectors 48 on the carts 32 with the electrical connectors 62 in the test chamber 10. The test chamber 10 may be converted to a walk-in chamber with a level floor and suitable for use without carts 32 by placing bars 68 in the slots 66.

Because there can be a tight fit between the ends 33 of the carts 32 and the seals 64, and between the electrical connectors 48 on the carts 32 and the electrical connectors 62 in the test chamber, the test chamber 10 is further provided with interengageable means on the carts 32 and in the test chamber for moving the carts 32 toward the air intake openings 58 with a positive seating force such that the main electrical connectors 48 are moved into engagement with the electrical connectors 62 in the test chamber 10, and such that the ends 33 of the carts 32 are moved into engagement with the seals 64.

Figure 9:
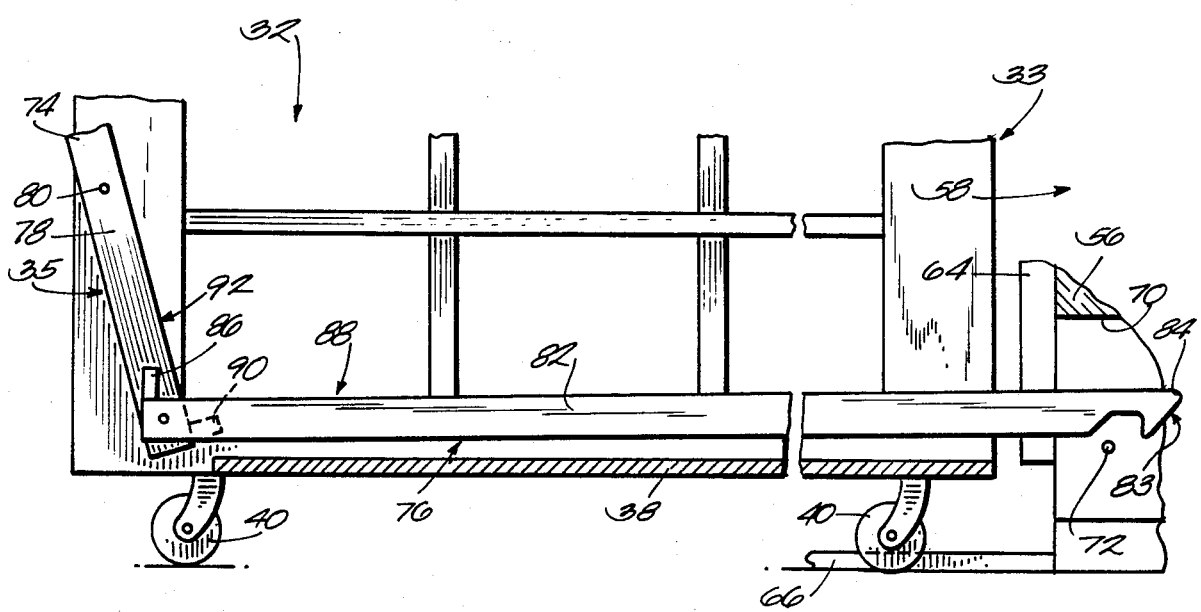
FIG. 9 is a view similar to the view in FIG. 8 showing the horizontal member of the interengageable means in the raised position.

In the preferred embodiment, the interengageable means includes recesses 70 in the wall of the test chamber near the bottoms of the air intake openings 58. Horizontal pins 72 in the recesses are parallel to and fixedly attached to the wall. This is best shown in FIGS. 8 and 9. The interengageable means further includes handles 74 (see FIGS. 1, 8, and 9) movably attached to the carts 32, and linkages 76 attached to the handles 74 for engaging the pins 72 and drawing the carts 32 toward the air intake openings 58 in response to movement of the handles 74.

Referring now to FIGS. 8 and 9, it will be seen that the handle 74 is pivotally attached to the end 35 of the cart 32. The handle 74 facilitates both pushing the cart 32 into the test chamber 10 and pulling the cart 32 out of the test chamber 10. The handle 74 includes two generally vertical members 78 pivotally attached to the cart 32 for pivotal movement about a generally horizontal axis 80, and the linkage 76 includes a pair of generally horizontal members 82 (only one is shown), one along each side of the cart and each having an end pivotally attached to the lower end of one of the vertical members 78 of the handle 74. The opposite ends of the horizontal members 82 include a hook 84 for engaging one of the horizontal pins 72. The hook ends of the horizontal members 82 are extendible and retractable relative to the end 33 of the cart 32 in response to pivotal movement of the handle 74. The hook ends of the horizontal members 82 are tapered at 83 to facilitate movement of the hook 84 over the pin 72.

The handle 74 and the horizontal member 82 also include means for lifting the hook end of the horizontal member 82 over the pin 72. In the preferred embodiment, this means includes an abutment 86 on the outer surface of the vertical member 74 adapted to engage the upper surface 88 of the horizontal member 82, and an abutment 90 on the inner surface of the horizontal member 82 adapted to engage the forward surface 90 of the vertical member 78. As best seen in FIGS. 8 and 9, the abutments 86 and 90 are positioned such that they do not engage their respective members until the horizontal member 82 is partially extended from the end 33 of the cart 32. Prior to engagement of the members by the abutments 86 and 90, the horizontal member 82 remains in a generally horizontal position, as shown in FIG. 8, being pivotally supported on one end by the lower of the vertical member 78, and being slidably supported along its length by the bottom wall 38 of the cart 32. However, when the abutments 86 and 90 engage their respective members, as shown in FIG. 9, the horizontal and vertical members 82 and 78 are locked together for joint movement so that further rotation of the vertical member 78 causes the hook end of the horizontal member 82 to be lifted relative to the cart 32 as well as to extend from the end 33 of the cart 32. As a result, the hook end of the horizontal member 82 is lifted over the horizontal pin 72.

When the upper end of the handle 74 is pushed back toward the cart 32 (clockwise movement), the hook end of the horizontal member 82 drops and retracts toward the cart 32 so that the hook 84 engages the horizontal pin 72. After this, further movement of the upper end of the handle 74 toward the cart 32 causes the cart 32 to be pulled toward the air intake opening 58 such that the end 33 of the cart 32 positively engages the seal 64 and the main electrical connector 48 positively engages the electrical connector 62 in the test chamber 10.

An alternative test chamber 100 is illustrated in FIGS. 13 and 14. In this alternative embodiment, the baskets 12 are inserted directly into the test chamber 100 without the carts 32. The test chamber 100 includes a rear wall 101 having mounted thereon a plurality of electrical connectors 102 engageable with the electrical connectors 28 on the baskets 12, as shown in FIG. 4. The baskets 12 are inserted into the test chamber 100 such that the second electrical connectors 28 engage the electrical connectors 102 on the rear wall, and with the side walls 20 of the baskets 12 facing either side of the test chamber 100. The side walls of the test chamber 100, the side walls 20 of the baskets 12, and the end walls 16 and 18 of the baskets 12 cooperate to define a vertical air plenum through which air flow will be directed vertically through the baskets 12 and over the circuit boards 14 supported therein. The test chamber 100 also includes means (shown schematically in dotted lines in FIG. 13) for circulating air through the baskets 12.

The test chamber 10 is used as follows. Circuit boards 14 are transported from an assembly or prior testing station to the burn-in station in the baskets 12. In the illustrated construction, forty baskets 12 are needed to fill the two carts 32. The circuit boards 14 are already plugged into the baskets 12.

At the burn in station, the baskets 12 are inserted into the two carts 32 such that the electrical connectors 28 on the ends of the baskets 12 engage the electrical connectors 42 inside the carts 32. When this is done, the circuit boards 14 inside the baskets 12 are electrically connected into the carts 32.

The carts 32 are then pushed into the test chamber 10 with the casters 40 on the carts 32 being received in the slots 66 in the floor of the test chamber 10. The slots 66 align the carts 32 with the air intake openings 58 and the main electrical connectors 48 on the carts 32 with the electrical connectors 62 in the test chamber 10.

When the carts 32 near the air intake openings 58, the handles 74 should be pulled away from the ends of the carts 32 so that the hook ends of the horizontal members 82 extend from the opposite ends of the carts 32, and such that the hooks 84 are moved over the horizontal pins 72. In the event that a tight fit between the ends of the carts 32 and the seals 64 or between the main electrical connectors 48 on the carts 32 and the electrical connectors 62 in the test chamber 10 prevents pushing the carts 32 by hand completely into the test chamber 10, the handles 74 can be used to pull the carts 32 into position. When the handles 74 are moved toward the carts 32, the hooks 84 engage the horizontal pins 72 and pull the carts 32 toward the air intake openings 58 such that the ends 33 of the carts register with the seals 64 and the air intake openings 58, and such that the electrical connectors 48 on the carts 32 engage the electrical connectors 62 in the test chamber 10. When the electrical connectors 48 and 62 are engaged, the circuit boards 14 are electrically connected to the control means in the test chamber 10 for recycling the circuit boards through the directed test procedure.

When the carts 32 are in this position, the test chamber doors 54 are closed and the air conditioning unit 56 is turned on. The air conditioning unit 56 blows air into the test chamber 10 through the air outlet openings 60. As shown by the arrows in FIG. 1, this conditioned air is drawn through the open ends 35 of the carts 32 and is into the air conditioning unit 56 through the air intake openings 58. Thus, the conditioned air passes over all of the circuit boards 14 contained within the carts 32. An air circulation path is established so that the conditioned air flows immediately over the circuit boards 14 contained within the carts 32. Therefore, when the air conditioning unit 56 is changed from a hot cycle to a cold cycle, or vice versa, the circuit boards 14 are almost immediately heated or cooled, and time is not wasted heating or cooling the remainder of the test chamber 10.

While the air conditioned unit 56 is operating, the electrical control means puts the circuit boards 14 through their operational cycles.

When the burning in is completed, the handles 74 may be used to pull the carts 32 out of the test chamber 10. The baskets 12 are then removed from the carts 32 and may be used to transport the circuit boards 14 to the next station for further processing.

Various features of the invention are set forth in the following claims.

We claim:

1. An apparatus for testing circuit boards, said apparatus comprising a plurality of hand manipulable circuit board baskets adapted to contain a plurality of generally planar circuit boards, each of said baskets including frame means defining a structure of generally open construction, said frame means including a box-like structure having opposite first and second sides, opposite third and fourth sides, and opposite first and second ends, said opposite ends and said first side being closed by walls to prevent air flow therethrough, and said second, third and fourth sides being open to permit air flow therethrough, the circuit boards being suported in perpendicular relation to said third and fourth sides, a plurality of first electrical connectors supported by said frame means and being adapted to engage electrical connectors on the circuit boards, a second electrical connector supported by said frame means and being electrically connected with each of said first electrical connectors, and means for supporting the circuit boards in parallel spaced relationship within said frame means with the electrical connectors on the circuit boards being plugged into said first electrical connectors, whereby in conjunction with said open construction of said frame means air can flow freely through said baskets and over the circuit boards supported therein, a test chamber for enclosing said baskets and including electrical connector means electrically connected with said second electrical connectors on said baskets, and wall means within said test chamber, said baskets being supported within said test chamber with said second side of one of said baskets being closed by said wall means and with said second side of each of the other baskets being closed by said first side of an adjacent basket, whereby said baskets and said wall means define a plurality of air plenums directing air flow through said baskets and over the circuit boards supported therein.

2. An apparatus as set forth in claim 1 and further comprising a cart within said test chamber, said cart including walls generally closing said cart except for opposite open ends and one open side between said open ends, a plurality of third electrical connectors mounted inside said walls, and electrical connector means in electrical circuit with said third electrical connectors and being adapted to be plugged into said test chamber, and wherein said baskets are insertable into said cart such that said second electrical connectors engage said third electrical connectors and such that said closed ends of said baskets close said open side of said cart, said cart and said baskets defining said air plenum.

3. An apparatus as set forth in claim 2 wherein said test chamber includes an airflow opening, with one of said open ends of said cart registering with said airflow opening, and the other of said open ends being open to the test chamber such that air flow is directed through said cart and said baskets between said airflow opening and said other of said open ends.

4. An apparatus as set forth in claim 5 and further comprising a flexible seal around one of said airflow opening and said one of said open ends of said cart for registering with the other of said airflow opening and said one of said open ends of said cart for substantially sealing said airflow opening to said cart.

5. An apparatus as set forth in claim 4 wherein said cart includes a plurality of casters supporting said cart for movement on a supporting surface, and wherein said test chamber includes a floor and a pair of slots in said floor for receiving said casters on said cart so as to align said cart with said airflow opening.

6. An apparatus as set forth in claim 4 wherein said electrical connector means includes a main electrical connector on said one of said open ends of said cart and slidably engageable with said electrical connector in said test chamber by moving said cart toward said airflow opening in said test chamber, and wherein said apparatus further comprises interengageable means on said cart and in said test chamber for moving said cart toward said airflow opening such that said main electrical connector is moved into engagement with said electrical connector in said test chamber.

7. An apparatus as set forth in claim 6 wherein said cart includes a plurality of casters supporting said cart for movement on a supporting surface, and wherein said test chamber includes a floor and a pair of slots in said floor for receiving said casters on said cart so as to align said cart with said airflow opening, and said main electrical connector on said cart with said electrical connector in said test chamber.

8. An apparatus as set forth in claim 6 wherein said interengageable means on said cart and in said test chamber includes a horizontal pin parallel to and fixedly attached to the wall within said test chamber that has said airflow opening therein, a handle movably attached to said cart, and a linkage attached to said handle for engaging said horizontal pin and moving said cart toward said airflow opening in said test chamber in response to movement of said handle.

9. An apparatus as set forth in claim 8 wherein said handle is movably attached to said other open end of said cart and has a lower end, and wherein said linkage is a generally horizontal member having a first end pivotally attached to said lower end of said handle and a second end extendible beyond said one open end of said cart and retractable into said open end of said cart in response to movement of said handle, said second end of said member including hook means for engaging said horizontal pin.

10. An apparatus as set forth in claim 9 wherein said handle and said horizontal member include interengageable means for lifting said second end of said member over said horizontal pin.

11. An apparatus as set forth in claim 1 wherein said supporting means are separate from said first electrical connectors.

12. An apparatus as set forth in claim 11 wherein said frame means includes a first side wall closing said first side and having an inner surface, wherein said first electrical connectors are generally evenly spaced along said inner surface of said first side wall, and wherein said supporting means are attached to said frame means between said first and second sides and are aligned with said first electrical connectors for supporting the circuit boards in engagement therewith.

13. An apparatus as set forth in claim 12 wherein said frame means has a first end wall closing said first end and having an outer surface, wherein said second electrical connector is fixedly attached to said outer surface of said first end wall, and wherein said supporting means includes a plurality of spaced apart guide tracks fixedly attached to said frame means and extending across said third and fourth sides between said first and second sides, said guide tracks being aligned with said first electrical connectors for guiding the connectors on the circuit boards into engagement with said first electrical connectors.

14. An apparatus as set forth in claim 12 and further comprising a handle attached to said frame means so as to facilitate hand manipulation of said basket.

15. An apparatus as set forth in claim 14 wherein said handle is attached to said second end.

16. An apparatus as set forth in claim 13 wherein said frame means further includes a second end wall enclosing said second end.

17. An apparatus as set forth in claim 13 wherein each of said guide tracks on said third side includes a channel-shaped member adapted to slidably receive an edge of a circuit board therebetween, and wherein each of said guide tracks on said fourth side includes a channel-shaped member adapted to slidably receive an edge of a circuit board therebetween.

18. An apparatus as set forth in claim 1 wherein said second electrical connector is located on one of said closed ends, wherein said test chamber includes opposite side walls and a rear wall having thereon a plurality of electrical connectors engageable with said second electrical connectors on said baskets, and wherein said baskets are insertable into said test chamber such that said second electrical connectors engage said electrical connectors on said real wall, and such that said side walls of said test chambers and said closed ends of said baskets cooperate to define an air plenum directing airflow vertically through said baskets and over the circuit boards supported therein.

19. An apparatus as set forth in claim 18 wherein said supporting means are separate from said first electrical connectors.

20. An apparatus as set forth in claim 19 wherein said frame means includes a first side wall closing said first side and having an inner surface, wherein said first electrical connectors are generally evenly spaced along said inner surface of said first side wall, and wherein said supporting means are attached to said frame means between said first and second sides and are aligned with said first electrical connectors for supporting the circuit boards in engagement therewith.

21. An apparatus as set forth in claim 20 wherein said frame means has a first end wall closing said first end and having an outer surface, wherein said second electrcial connector is fixedly attached to said outer surface of said first end wall, and wherein said supporting means includes a plurality of spaced apart guide tracks fixedly attached to said frame means and extending across said third and fourth sides between said first and second sides, said guide tracks being aligned with said first electrical connectors for guiding the connectors on the circuit boards into engagement with said first electrical connectors.

22. An apparatus as set forth in claim 20 and further comprising a handle attached to said frame means so as to facilitate hand manipulation of said basket.

23. An apparatus as set forth in claim 22 wherein said handle is attached to said second end.

24. An apparatus as set forth in claim 21 wherein said frame means further includes a second end wall enclosing said second end.

25. An apparatus as set forth in claim 21 wherein each of said guide tracks on said third side includes a channel-shaped member adapted to slidably receive an edge of a circuit board therebetween, and wherein each of said guide tracks on said fourth side includes a channel-shaped member adapted to slidably receive an edge of a circuit board therebetween.

26. An apparatus for use in testing circuit boards in a test chamber having an airflow opening, said apparatus comprising a plurality of hand manipulable circuit board baskets adapted to contain a plurality of circuit boards, said baskets each including frame means defining a structure of generally open construction and having a closed end, a plurality of first electrical connectors supported by said frame means and adapted to engage electrical connectors on the circuit boards, a second electrical connector supported by said frame means, said second connector being electrically connected with each of said first electrical connectors and adapted to be plugged into the test chamber, and means for supporting the circuit boards in parallel spaced relationship within said frame means and in parallel relation to said closed end with the electrical connectors on the circuit boards being plugged into said first electrical connectors, and a cart adapted to be placed within the test chamber, said cart including walls generally closing said cart except for opposite open ends and one open side between said open ends, a plurality of third electrical connectors mounted inside said walls, and electrical connector means in electrical circuit with said third electrical connectors and being adapted to be plugged into the test chamber, said baskets being supported in said cart such that said second electrical connectors engage said third electrical connectors, such that said closed ends of said baskets close said open side of said cart, and such that the circuit boards extend parallel to the direction between said open ends, and said cart and said baskets forming an air plenum having said opposite open ends and being adapted to contain the circuit boards with one of said open ends being adapted to register with the airflow opening in the test chamber, and the other of said open ends being adapted to be open to the test chamber such that air flow is directed through said cart and said baskets between the airflow opening and said other of said open ends.

27. An apparatus for use in testing circuit boards in a test chamber having an airflow opening, said apparatus comprising a cart adapted to be placed within the test chamber, said cart including a top wall and side walls generally closing said cart except for opposite open ends and one open side between said open ends, a plurality of third electrical connectors mounted inside said walls, and electrical connector means in electrical circuit with said third electrical connectors and being adapted to be plugged into the test chamber, and a plurality of circuit board baskets adapted to contain a plurality of circuit boards, said baskets each including a closed end, a closed bottom, an open top, and a second electrical connector adapted to be in electrical circuit with each of the circuit boards, said baskets being supported in said cart such that said second electrical connectors engage said third electrical connectors and such that said closed ends of said baskets close said open side of said cart, and said baskets being arranged in a plurality of rows and in a plurality of columns such that in each column said open top of the uppermost basket is closed by said top wall of said cart and said open top of each of the other baskets is closed by said closed bottom of the upwardly adjacent basket, such that in the uppermost row said closed bottoms are aligned in planar, end-to-end relation and said open tops are closed by said top wall, and such that in the other rows said closed bottoms are aligned in planar, end-to-end relation and said open tops are closed by said closed bottoms of the upwardly adjacent row, whereby said top wall and said baskets cooperate to define a plurality of horizontal air ducts corresponding to said rows, said cart and said baskets forming a closed air plenum including said air ducts, having said opposite open ends and being adapted to contain the circuit boards, with one of said open ends being adapted to register with the airflow opening in the test chamber, and the other of said open ends being adapted to be open to the test chamber such that air flow is directed through said cart and said baskets, through said ducts and between the airflow opening and said other of said open ends.

28. An apparatus for testing circuit boards, said apparatus comprising a cart including walls generally closing said cart except for opposite open ends and one open side between said open ends, a plurality of third electrical connectors mounted inside said walls, a main electrical connector mounted on one of said open ends and in electrical circuit with said third electrical connectors, and a plurality of casters supporting said cart for movement on a supporting surface, a plurality of circuit board baskets adapted to contain a plurality of circuit boards, said baskets each including a closed end and a second electrical connector adapted to be in electrical circuit with each of the circuit boards, said baskets being insertable into said cart such that said second electrical connectors engage said third electrical connectors and such that said closed ends of said baskets close said open side of said cart, a test chamber for enclosing said cart, said test chamber including air conditioning means having an airflow opening registering with said one of said open ends of said cart, an electrical connector slideably engageable with said main electrical connector, a floor, and a pair of slots in said floor for receiving said casters on said cart so as to align said cart with said airflow opening and said main electrical connector on said cart with said electrical connector in said test chamber, a flexible seal around said airflow opening and registering with said one of said open ends of said cart for substantially sealing said airflow opening to said cart, and interengageable means on said cart and in said test chamber for moving said cart toward said airflow opening such that said main electrical connector engages said electrical connector in said test chamber, said cart and said baskets forming a closed air plenum having said opposite open ends and being adapted to contain the circuit boards, with said one of said open ends registering with said airflow opening in said test chamber and said main electrical connector engaging said electrical connector in said test chamber, and with the other of said open ends being open to said test chamber such that airflow is directed through said cart and said baskets between the airflow opening and said other of said open ends.

29. An apparatus as set forth in claim 28 wherein said interengageable means includes a horizontal pin parallel to and fixedly attached to the wall within said test chamber that has said airflow opening therein, a handle movably attached to said cart, and a linkage attached to said handle for engaging said horizontal pin and moving said cart toward said airflow opening in said test chamber in response to movement of said handle.

30. An apparatus as set forth in claim 29 wherein said cart includes an end opposite said open end, wherein said handle is movably attached to said opposite end of said cart and has a lower end, and wherein said linkage is a generally horizontal member having a first end pivotally attached to said lower end of said handle and a second end extendible beyond said open end of said cart and retractable into said open end of said cart in response to movement of said handle, said second end of said member including hook means for engaging said horizontal pin.

31. An apparatus as set forth in claim 30 wherein said handle and said horizontal member include interengageable means for lifting said second end of said member over said horizontal pin.

32. A hand manipulable basket for containing a plurality of generally planar circuit boards to be tested, said basket comprising frame means defining a structure of generally open construction, a plurality of first electrical connectors supported by said frame means and being adapted to engage electrical connectors on the circuit boards, a second electrical connector supported by said frame means and being electrically connected with each of said first electrical connectors and adapted to be plugged into a test chamber, and means for supporting the circuit boards in parallel spaced relationship within said frame means with the electrical connectors on the circuit boards being plugged into said first electrical connectors, said frame means being characterized in that it has a box-like structure having opposite first and second sides, opposite third and fourth sides, and opposite first and second ends, said opposite ends and said first side being closed by walls to prevent air flow therethrough, and said second, third and fourth sides being open to permit air flow therethrough, the circuit boards being supported in perpendicular relation to said opposite open sides, whereby when said basket is supported adjacent another basket with the closed first side of the other basket closing said second side of said basket, said frame means defines a plenum so that air can flow freely through said basket and over the circuit boards supported therein.

33. A basket as set forth in claim 32 wherein said supporting means are separate from said first electrical connectors.

34. A basket as set forth in claim 33 wherein said frame means defines a box-like structure having opposite first and second sides, opposite third and fourth sides, and opposite first and second ends, said frame means including a first side wall closing said first side and having an inner surface, wherein said first electrical connectors are generally evenly spaced along said inner surface of said first side wall, and wherein said supporting means are attached to said frame means between said first and second sides and are aligned with said first electrical connectors for supporting the circuit boards in engagement therewith.

35. An apparatus as set forth in claim 34 wherein said frame means has a first end wall closing said first end and having an outer surface, wherein said second electrical connector is fixedly attached to said outer surface of said first end wall, and wherein said supporting means includds a plurality of spaced apart guide tracks fixedly attached to said frame means and extending across said third and fourth sides between said first and second sides, said guide tracks being aligned with said first electrical connectors for guiding the connectors on the circuit boards into engagement with said first electrical connectors.

36. A basket as set forth in claim 34 and further comprising a handle attached to said frame means so as to facilitate hand manipulation of said basket.

37. A basket as set forth in claim 36 wherein said handle is attached to said second end.

38. A basket as set forth in claim 36 wherein said second, third and fourth sides are open, and wherein said frame means further includes a second end wall enclosing said second end.

39. A basket as set forth in claim 36 wherein each of said guide tracks on said third side includes a channel-shaped member adapted to slidably receive an edge of a circuit board therebetween, and wherein each of said guide tracks on said fourth side includes a channel-shaped member adapted to slidably receive an edge of a circuit board therebetween.

40. An apparatus as set forth in claim 1 wherein said baskets are arranged in a plurality of rows and in a plurality of columns, and wherein said baskets are supported with said open second sides facing upwardly and with said closed first sides facing downwardly such that in each column said second side of the uppermost basket is closed by said wall means and said second side of each of the other baskets is closed by said first side of the upwardly adjacent basket, such that in the uppermost row said closed first sides are aligned in planar, end-to-end relation and said open second sides are closed by said wall means, and such that in the other rows said closed first sides are aligned in planar, end-to-end relation and said open second sides are closed by said first sides of the upwardly adjacent row, whereby said wall means and said baskets cooperate to define a plurality of horizontal air ducts corresponding to said rows.

* * * * *

UNITED STATES PATENT AND TRADEMARK OFFICE
CERTIFICATE OF CORRECTION

PATENT NO. : 4,683,424

DATED : July 28, 1987

INVENTOR(S) : Robert A. Cutright, Mark W. Briggs, George J. Bouwman

It is certified that error appears in the above-identified patent and that said Letters Patent is hereby corrected as shown below:

Column 9, line 27, "5" should be --3--.

Column 11, lines 12/13 "electrcial" should be --electrical--.

Column 14, line 48, "includds" should be --includes--.

Signed and Sealed this

Sixteenth Day of February, 1988

Attest:

DONALD J. QUIGG

Attesting Officer

Commissioner of Patents and Trademarks